United States Patent [19]
Francisco et al.

[11] Patent Number: 6,128,508
[45] Date of Patent: *Oct. 3, 2000

[54] COMMUNICATIONS SYSTEM USING MULTI-BAND AMPLIFIERS

[75] Inventors: Mark Francisco, Millstone Township, Monmouth County; Ralph Francis Trambarulo, Red Bank, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/777,333

[22] Filed: Dec. 27, 1996

[51] Int. Cl.⁷ .................................................... H03F 3/68
[52] U.S. Cl. ..................... 455/552; 455/426; 455/73; 455/168.1; 455/188.1; 330/126
[58] Field of Search .................................. 455/454, 552, 455/553, 232.1, 234.1, 126, 127, 73, 78–84, 550, 168.1, 188.1, 426; 330/286, 277, 306, 126

[56] References Cited

U.S. PATENT DOCUMENTS

| | | | |
|---|---|---|---|
| 4,888,815 | 12/1989 | Ahlemeyer et al. | 455/168.1 |
| 5,060,294 | 10/1991 | Schwent et al. | 455/127 |
| 5,177,452 | 1/1993 | Honjo | 330/277 |
| 5,202,649 | 4/1993 | Kashiwa | 330/277 |
| 5,361,403 | 11/1994 | Dent | 455/127 |
| 5,406,615 | 4/1995 | Miller, II et al. | |
| 5,590,412 | 12/1996 | Sawai et al. | 455/83 |
| 5,771,026 | 6/1998 | Stengel, Jr. | 343/745 |
| 5,774,017 | 6/1998 | Adar | 330/126 |

*Primary Examiner*—Doris H. To
*Attorney, Agent, or Firm*—Kay, Scholer, Fierman, Hays & Handler, LLP

[57] ABSTRACT

In a communications system, a multi-band power amplifier is employed to increase the power level of a signal for transmission over one of multiple frequency bands. In addition, a multi-band low noise amplifier is employed to scale the signal level of a signal received from one of the multiple frequency bands. In accordance with the invention, each multi-band amplifier is designed such that the gain values afforded by the amplifier to the components of the communication signal within the multiple frequency bands are significantly higher than the gain values to the signal components outside those bands.

19 Claims, 3 Drawing Sheets

COMMUNICATIONS SYSTEM USING MULTI-BAND AMPLIFIERS

FIELD OF THE INVENTION

The invention relates to communications systems, and more particularly to those systems using amplifiers to transmit signals over multiple frequency bands.

BACKGROUND OF THE INVENTION

Radiotelephones including cellular telephones and cordless telephones are ubiquitously used for day-to-day communications. Such radiotelephones utilize various frequency bands to transmit signals. For example, cellular telephones transmit signals in the 824 to 849 MHz band pursuant to the advanced mobile phone system (AMPS) cellular standard. With the licensing of additional spectrum for personal communications system (PCS) use, the cellular telephones can also transmit signals in the 1.85 to 1.91 GHz PCS band. On the other hand, handsets of cordless telephones may transmit signals at a frequency band of 2475 MHz to 2483.5 MHz, which is within the FCC provisions for unlicensed, non-spread-spectrum, industrial, scientific, medical (ISM) band use.

Radiotelephones capable of transmitting signals over multiple frequency bands are well-known. One such radiotelephone is disclosed in U.S. Pat. No. 5,406,615 issued to Miller, II et al. The disclosed radiotelephone is a handset capable of communicating signals over the cellular band and the ISM band. The circuits of the multi-band radiotelephones including the Miller handset are more or less duplicative of those of single-band radiotelephones. As such, with respect to a single-band radiotelephone, a multi-band radiotelephone is normally more bulky in size, costly and unreliable as the manifold circuit components are introduced into the radiotelephone. For example, among other things, the multi-band radiotelephone typically employs in a transmitter a power amplifier for each of the many transmit frequency bands. Such a power amplifier is usually expensive and bulky.

Accordingly, there exists a need to improve the circuit of a multi-band communications system, in particular, the multi-band radiotelephone, so that the circuit utilizes the space more efficiently, and is less expensive and more reliable.

SUMMARY OF THE INVENTION

The invention overcomes the prior art limitations by employing a multi-band amplifier in a communications system to scale the signal level of a signal communicated over one of multiple frequency bands. In accordance with the invention, the multi-band amplifier uses an input network to achieve a selected input impedance, and an output network to achieve a selected output impedance. The values of the input and output impedances are selected such that the gain values afforded by the multi-band amplifier to the components of the communication signal within the multiple frequency bands are significantly higher than the gain values to the signal components outside those bands.

Advantageously, the inventive multi-band amplifier can replace multiple prior-art amplifiers each handling communication signals associated with only one frequency band. As a result, the circuit of the communications system in accordance with the invention utilizes the space efficiently, and is inexpensive and reliable.

DETAILED DESCRIPTION

Figure 1:
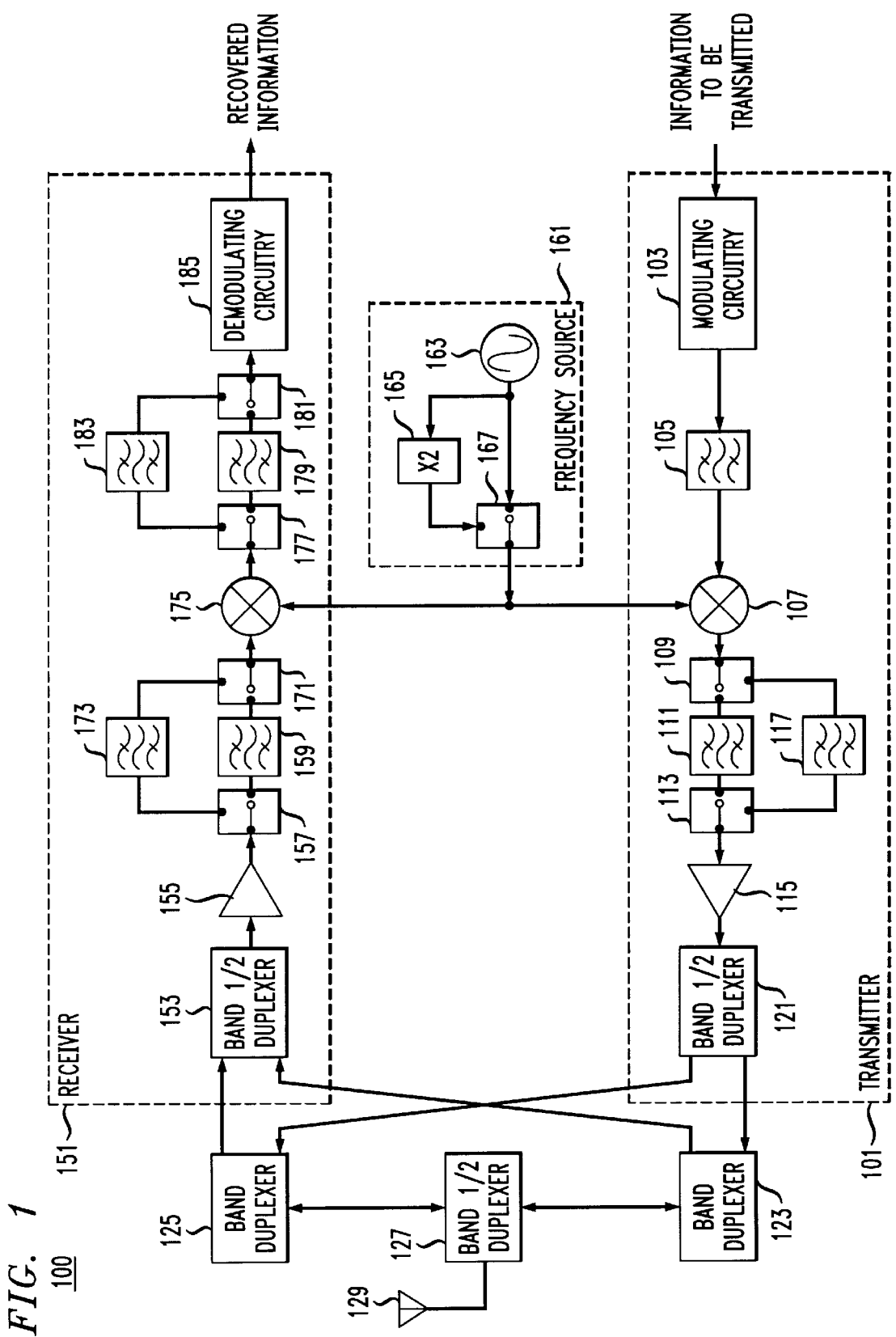
FIG. 1 illustrates a system for communicating signals over cellular and PCS bands in accordance with the invention.

FIG. 1 illustrates communications system 100 embodying the principles of the invention. In this illustrative embodiment, system 100 is a portable radiotelephone for wireless communications over a first set of frequency bands pursuant to the AMPS cellular standard, and a second set of frequency bands for personal communications system (PCS) use.

Figure 2:
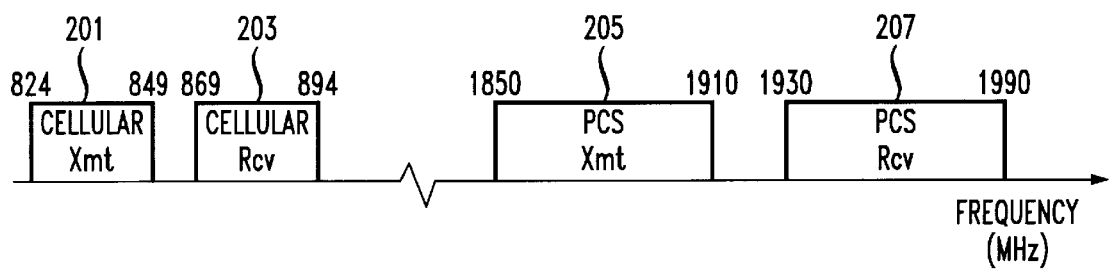
FIG. 2 illustrates cellular transmit and receive bands and PCS transmit and receive bands in the frequency spectrum.

FIG. 2 illustrates the first set of frequency bands comprising cellular transmit (Xmt) band 201 and receive (Rcv) band 203 in the frequency spectrum. Specifically, band 201 ranging from 824 MHz to 849 MHz is assigned for transmission by system 100 of cellular communication signals to a remote base station (not shown), where the signals are processed and directed to an intended receiver in a conventional manner. To realize duplex wireless communications, band 203 ranging from 869 MHz to 894 MHz is assigned for reception by system 100 of cellular communication signals from the remote base station. The received communications signals came from an originating transmitter (not shown) and have been processed by the remote base station in a conventional manner. Also shown in FIG. 2 is the second set of frequency bands comprising PCS Xmt band 205 and Rcv band 207. Similarly, band 205 ranging from 1.85 GHz to 1.91 GHz is assigned for transmission by system 100 of PCS communication signals to a remote base station. Band 207 ranging from 1.93 GHz to 1.99 GHz is assigned for reception by system 100 of PCS communication signals from the remote base station.

Referring back to FIG. 1, system 100 comprises, inter alia, transmitter 101 and receiver 151. A source signal representing information to be transmitted is fed to modulating circuitry 103 in transmitter 101. This source signal may be in an analog or a digital form. If the source signal is an analog signal, circuitry 103 processes the signal to generate a frequency-modulated (FM) signal in accordance with a standard frequency division multiple access (FDMA) scheme. On the other hand, if the source signal is a digital signal, circuitry 103 processes the signal to generate a digitally modulated signal in accordance with a standard code division multiple access (CDMA) scheme. For details on the CDMA scheme, one may refer to: J. White, "What is CDMA?", *Applied Microwave & Wireless,* Fall 1993, pp. 5, 6 & 8.

The modulated signal is forwarded to intermediate frequency (IF) filter 105 which is a band-pass filter of conventional design. Illustratively, the center frequency of filter 105 is 165 MHz and it has a passband of ±600 KHz from the center frequency. Filter 105 is used to eliminate from the modulated signal unwanted signal components outside the passband. The filtered signal is then provided to mixer 107 where the signal is frequency-translated into either cellular Xmt band 201 or PCS Xmt band 205 in response to a mixing frequency provided by frequency source 161. The latter includes reference oscillator 163 which generates a first mixing frequency 1,023 MHz. Oscillator 163 provides the first mixing frequency to band selection switch 167, and also to frequency doubler 165 where the mixing frequency is doubled. Doubler 165 thus provides a second mixing frequency 2,046 MHz (2×1,023 MHz) to switch 167. In a first position (as shown), switch 167 relays the first mixing frequency 1,023 MHz to mixer 107, resulting in a frequency-translation of the filtered signal into cellular Xmt band 201. In a second position, switch 167 relays the second mixing frequency 2,046 MHz to mixer 107, resulting in a frequency-translation of the filtered signal into PCS Xmt band 205.

It should be noted at this point that the particular position of band selection switch 167 has been determined before any transmission by system 100 takes place. This stems from the fact that in accordance with a standard wireless communications service, system 100 uses a control circuit (not shown) to listen to pilot signals sent from a base station during an idle state. Each pilot signal includes paging information. By processing such information using the control circuit, system 100 knows, for example, when it is about to receive a message, what codes and modulation scheme were applied to the message to be received, and what receive band to be used for receiving the message. Moreover, for transmission of a message, system 100 is informed, for example, what transmit band should be used, and how much transmission power is required. The particular band used (the PCS band versus the cellular band) and the amount of power required depend on the current distance between system 100 and the remote base station.

Band selection switch 167, together with other switches shown in FIG. 1 (i.e., switches 109, 113, 157, 171, 177 and 181), is preset according to the above paging information such that system 100 transmits and receives signals using the proper frequency bands and appropriate protocols. In accord with switch 167, band selection switches 109 and 113 are preset to either their first positions or second positions. In their respective first positions (as shown), switches 109 and 113 relay the frequency-translated signal from mixer 107 to multi-band power amplifier 115 through image rejection filter 111. Filter 111 is a band-pass filter having a passband of 824 MHz to 849 MHz. It eliminates from the signal unwanted signal components outside cellular Xmt band 201. In their respective second positions, switches 109 and 113 relay the frequency-translated signal to amplifier 115 through image rejection filter 117. Filter 117 is a band-pass filter having a passband of 1.85 GHz to 1.91 GHz. It eliminates from the signal unwanted signal components outside PCS Xmt band 205.

The structure of multi-band power amplifier 115 in accordance with the invention is fully described hereinbelow. It suffices to know for now that unlike a prior art power amplifier which provides a desired gain to a signal within only a particular transmit band, amplifier 115 provides, in an efficient manner, a desired gain to a signal within any one of the many discrete transmit bands. As a result, in this instance, amplifier 115 replaces two prior art power amplifiers which would otherwise be employed to handle signals within cellular Xmt band 201 and PCS Xmt band 205 separately. Advantageously, with multi-band power amplifier 115, the circuit of system 100, with respect to its prior art counterpart, is less expensive and bulky, and more reliable due to use of at least fewer power amplifiers.

In any event, amplifier 115 increases the power level of the signal from either filter 111 or filter 117 for transmission. The amplified signal to be transmitted is fed to band half-duplexer 121 which is a first common junction separating a cellular transmit signal within Xmt band 201 from a PCS transmit signal within Xmt band 205. If the amplified signal is a cellular transmit signal, it would thence be sent to band duplexer 123. The latter is a second common junction separating the cellular transmit signal from any cellular receive signal within cellular Rcv band 203. The cellular transmit signal would then be forwarded to band half-duplexer 127. On the other hand, if the amplified signal is a PCS transmit signal, it would be sent from band half-duplexer 121 to band duplexer 125. The latter is a third common junction separating the PCS transmit signal from any PCS receive signal within PCS Rcv band 207. The PCS transmit signal would then be forwarded to band half-duplexer 127.

Band half-duplexer 127 is a fourth common junction where cellular transmit and receive signals are separated from any PCS transmit and receive signals. Half-duplexer 127 causes the above amplified signal to be transmitted onto the proper transmit band (either band 201 or band 205) through antenna 129.

In duplex wireless communications, system 100 receives a signal from a specified receive band via antenna 129. If the received signal is a cellular receive signal from cellular Rcv band 203, band half-duplexer 127 directs the signal to band duplexer 123. The latter in turn directs the cellular receive signal to band half-duplexer 153 within receiver 151. If the received signal is a PCS receive signal from PCS Rcv band 207, band half-duplexer 127 directs the signal to band duplexer 125. The latter in turn directs the PCS receive signal to band half-duplexer 153.

Band half-duplexer 153 is a fifth common junction which feeds the received signal, either a cellular receive signal or PCS receive signal, to multi-band low-noise amplifier (LNA) 155 in accordance with the invention. The structure of multi-band LNA, along with that of multi-band amplifier 115, is fully described hereinbelow. Like amplifier 115, LNA 155 replaces two prior art LNAs which would otherwise be employed to handle cellular receive signals and PCS receive signals separately.

In any event, multi-band LNA 155 provides an appropriate gain to the received signal. Band selection switch 157 is preset based on the paging information to a first position (as shown) to relay the amplified signal to image rejection filter 159 if the received signal is a cellular receive signal. Filter 159 is a band-pass filter having a passband of 869 MHz to 894 MHz. It eliminates from the amplified signal unwanted signal components outside cellular Rcv band 203. Alternatively, switch 157 is preset to a second position to relay the amplified signal to image rejection filter 173 if the received signal is a PCS receive signal. Filter 173 is a band-pass filter having a passband of 1.93 GHz to 1.99 GHz. It eliminates from the amplified signal unwanted signal components outside PCS Rcv band 207.

In accord with switch 157, band selection switch 171 and switch 167 in frequency source 161 are preset such that in their respective first positions (as shown), switch 171 relays the filtered signal from filter 159 to mixer 175 at its first input, and switch 167 relays a mixing frequency 1,023 MHz to mixer 175 at its second input. Alternatively, in their respective second positions, switch 171 relays the filtered signal from filter 173 to mixer 175 at its first input, and switch 167 relays a mixing frequency 2,046 MHz to mixer 175 at its second input.

In either event, mixer 175 frequency-translates the filtered signal to be around an IF 85 MHz. Switches 177 and 181 are preset based on the paging information relating to the modulation scheme applied to the received signal. If it is a digital modulation scheme, i.e., CDMA, switches 177 and 181 would be preset to their respective first positions (as shown) to relay the frequency-translated signal to demodulating circuitry 185 through IF filter 179. Otherwise if it is an analog modulated scheme, i.e., FDMA, switches 177 and 181 would be preset to their respective second positions to relay the frequency-translated signal to circuity 185 through IF filter 183. Filter 179 is a band-pass filter having a center frequency 85 MHz and a passband of ±600 KHz from the center frequency. Similarly, filter 183 is a band-pass filter having a center frequency 85 MHz and a passband of ±15 KHz from the center frequency. In either event, the filtered signal is demodulated by circuitry 185 according to its modulation scheme, thereby recovering the information represented by the received signal.

Figure 3:
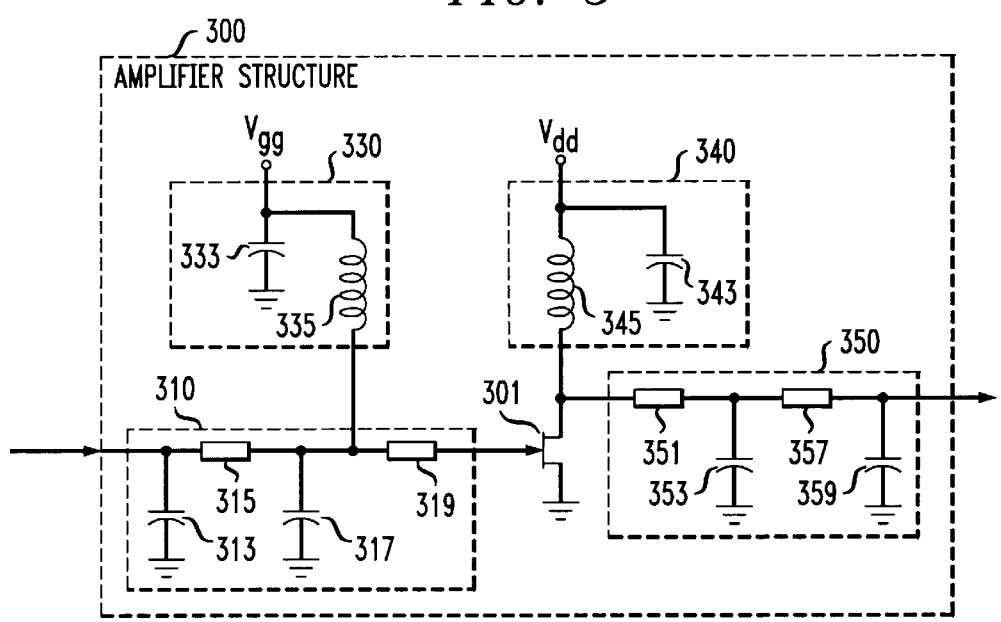
FIG. 3 illustrates a circuit embodying the principles of the invention for multi-band amplifiers used in the system of FIG. 1.

The structure of multi-band power amplifier 115 and that of multi-band LNA 155 will now be described. Although the values of the components may vary according to their specific applications, the structures of amplifiers 115 and 155 are similar. FIG. 3 illustrates amplifier structure 300 in accordance with the invention suitable for amplifier 115 and LNA 155.

As shown in FIG. 3, central to amplifier structure 300 is field effect transistor (FET) 301. The source terminal of transistor 301 is connected to ground. Its gate terminal is connected to input matching network 310 coupled to gate bias circuit 330. The drain terminal of the transistor is connected to drain bias circuit 340 and also to output matching network 350.

Capacitor 313 in network 310 at one end is connected to ground, and at the other end to an input to structure 300 and transmission line 315. Transmission line 315 connects capacitor 313 to capacitor 317, which at one end is connected to ground, and at the other end to transmission line 319 and circuit 330, in addition to transmission line 315. Transmission line 319 connects both capacitor 317 and circuit 330 to the gate terminal of transistor 301.

Gate bias circuit 330 comprises capacitor 333 and inductive choke 335. Capacitor 333 is connected to ground at one end, and to inductive choke 335 and a voltage source (e.g., a battery) providing a voltage $V_{gg}$ at the other end. Inductive choke 335 is also connected to capacitor 317 and transmission line 319 in network 310.

Similar to gate bias circuit 330, drain bias circuit 340 comprises capacitor 343 and inductive choke 345. Capacitor 343 is connected to ground at one end, and to inductive choke 345 and the above voltage source, $V_{dd}$, at the other end. Inductive choke 345 is also connected to the drain terminal of transistor 301 and output matching network 350.

Transmission line 351 in network 350 connects the drain terminal of transistor 301 to capacitor 353. Capacitor 353 at one end is grounded and at the other end connected to transmission line 357, in addition to transmission line 351. Transmission line 357 is connected, at an output of amplifier structure 300, to capacitor 359 which is grounded at its other end.

As mentioned before, the values of the components of amplifier structure 300 for multi-band LNA 155 differ from those for multi-band power amplifier 115. LNA 155 pursuant to amplifier structure 300 will now be defined. In LNA 155, input matching network 310 is synthesized such that the source impedance of band half-duplexer 153 of FIG. 1 is transformed to $\Gamma_{OPT}$, which represents the source reflection coefficient giving minimum noise in Rcv bands 203 and 207, and whose value is provided by the manufacturer of transistor 301. The values of the individual components within network 310 to realize such a transformation can be readily determined by well-known methods. Bias circuit 330 in LNA 155 is synthesized such that the impedance presented to transistor 301 over bands 203 and 207 is much greater than the source impedance $\Gamma_O$. Output matching network 350 in LNA 155 is synthesized such that the load impedance ($Z_{L155}$) at band switch 157 presented to transistor 301 is transformed according to the following expression:

$$Z_{L155} = Z^*_{output},$$

where $Z^*_{output}$ represents the complex conjugate of the output impedance of transistor 301 when presented with input matching network 310. Again, the values of the individual components within network 350 to realize such a transformation can be readily determined by well-known methods. Bias circuit 340 in LNA 155 is synthesized such that the impedance presented to transistor 301 over bands 203 and 207 is much greater than the load impedance $Z_{L155}$.

Amplifier 115 pursuant to amplifier structure 300 will now be defined. In amplifier 115, output matching network 350 is synthesized such that the load impedance ($Z_{L115}$) of band half-duplexer 121 of FIG. 1 presented to transistor 301 over Xmt bands 201 and 205 is transformed according to the following expression:

$$Z_{L115} = \frac{V_{dd}}{2 * I_{qA}},$$

where $V_{dd}$ represents the drain supply voltage, and $I_{qA}$ represents the quiescent drain current of class-A operation. In a well-known manner, the values of the individual components within network 350 can be readily determined to realize such a transformation. Bias circuit 340 in amplifier 115 is synthesized such that the impedance presented to transistor 301 over bands 201 and 205 is much greater than the load impedance $Z_{L115}$. Input matching network 310 in amplifier 115 is synthesized such that the source impedance ($Z_S$) presented at switch 113 over bands 201 and 205 is transformed according to the following expression:

$$Z_S = Z^*_{input},$$

where $Z^*_{input}$ represents the complex conjugate of the input impedance of transistor 301 when presented with output matching network 350. Again, in a well-known manner, the values of the individual components within network 310 can be readily determined to realize such a transformation. Bias circuit 330 in amplifier 115 is synthesized such that the impedance presented to transistor 301 over bands 201 and 205 is much greater than the source impedance $Z_S$.

With the above definitions, input matching network 310 provides an optimum input impedance match over the multiple bands of interest (in this instance the cellular and PCS transmit bands for amplifier 115, or the cellular and PCS receive bands for LNA 155). At the same time, output matching network 350 provides an optimum output impedance match over the same bands. The maximum power transfer in the multiple bands of interest is thus achieved by amplifier structure 300 in accordance with the invention.

Figure 4:
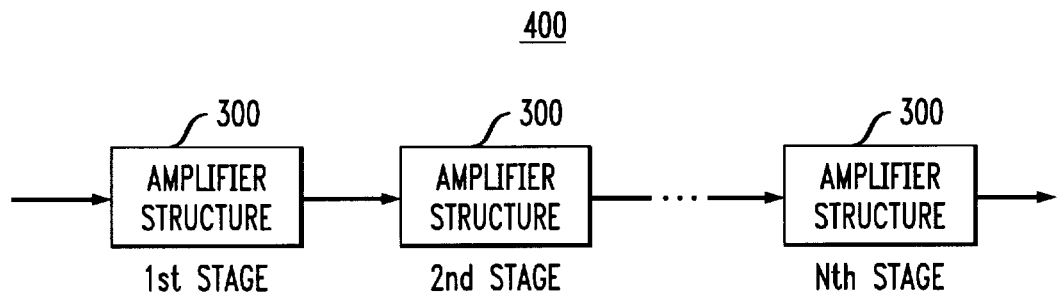
FIG. 4 illustrates a multi-band amplifier structure comprising a concatenation of circuits of FIG. 3.

It should be pointed out that the gain afforded by amplifier structure 300 can be increased by repeating the structure in concatenation. FIG. 4 illustrates amplifier structure 400 having N stages in cascade each comprising structure 300, where N>1. It can be shown that the gain afforded by structure 400 is N times that afforded by structure 300.

Figure 5:
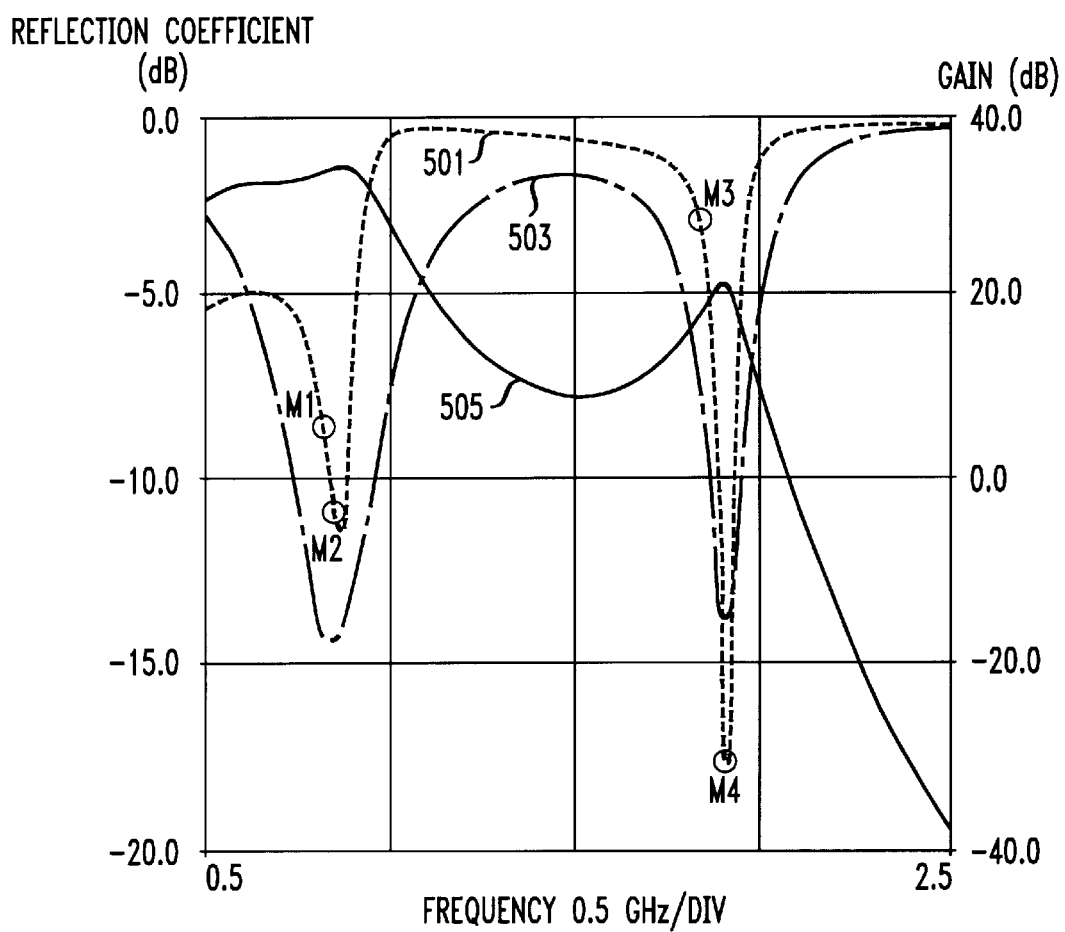
FIG. 5 is a graph depicting the performance of a preferred multi-band power amplifier in accordance with the amplifier structure of FIG. 4.

FIG. 5 is a graph depicting the performance of a preferred multi-band power amplifier for use as amplifier 115 in system 100. This preferred amplifier is designed in accordance with amplifier structure 400, where N=2. The return loss at the input of the amplifier with respect to the frequency is depicted by dash line 501 in FIG. 5. Because of the matching input impedance introduced in accordance with the invention, the input reflection coefficient of the preferred amplifier is relatively low over cellular transmit band 201 (demarcated by M1 and M2), and PCS transmit band 205 (demarcated by M3 and M4). The reflection coefficient at the output of the amplifier with respect to the frequency is depicted by dash-dotted line 503. Because of the matching output impedance introduced in accordance with the invention, the output return loss of the preferred amplifier is also relatively low over cellular transmit band 201 and PCS transmit band 205.

The gain afforded by the preferred amplifier with respect to the frequency is depicted by solid line 505. In accord with the relatively low input and output reflection coefficients over band 201 and band 205, the values of the amplifier gain over those two transmit bands are relatively high, peaking at about 35 dB and 20 dB, respectively. As shown in FIG. 5, in accordance with the invention, the amplifier gain values are drastically lower outside the transmit bands of interest. Thus, spurious signals outside of the transmit bands produce lower strength mixing products in both bands which can degrade system performance. Furthermore, the power efficiency of system 100 is advantageously high as it affords a minimal gain and thus minimal power to the transmit signal components outside the transmit bands. This high power efficiency results in a desirably long battery life in system 100.

Gain shaping in the LNAs also reduces receiver interference from mixing products of out-of-band signals entering the receive chain.

The foregoing merely illustrates the principles of the invention. It will thus be appreciated that a person skilled in the art will be able to devise numerous multi-band communications systems which, although not explicitly shown or described herein, embody the principles of the invention and are thus within its spirit and scope.

For example, in the disclosed embodiment, communications system 100 including multi-band amplifiers 115 and 155 is illustratively operative to transmit and receive signals over the cellular and PCS bands. These operating bands are illustrative and are not intended to be limiting in terms of their number or frequencies. Use of two or more operating bands in accord with the invention suggests itself to those skilled in the art.

We claim:

1. A communications system comprising:
    an interface for transmitting signals over at least one of a plurality of frequency bands;
    an amplifier for scaling signal levels of said signals, said amplifier further comprising:
        an amplifying element having at least one terminal;
        a plurality of transmission lines for adjusting an input impedance to said amplifying element to a selected value, only a first one of said transmission lines being connected to said terminal to form a serial relation with said amplifying element, a second one of said transmission lines being connected at an end thereof to the first transmission line and at the other end thereof to an input of said amplifier; and
        an output network for providing a selected output impedance to said amplifying element, values of the input and output impedances being selected such that gain values afforded by said amplifier to components of said signals in said plurality of frequency bands are relatively high, with respect to gain values to components of said signals outside said plurality of frequency bands.

2. The system of claim 1 wherein said amplifying element is a transistor.

3. The system of claim 2 wherein said transistor is a field effect transistor (FET).

4. The system of claim 1 wherein said plurality of frequency bands include a transmit band for cellular communications.

5. The system of claim 1 wherein said plurality of frequency bands include a transmit band for personal communications system (PCS) use.

6. The system of claim 1 further comprising only one input impedance network including the plurality of transmission lines for adjusting the input impedance to said amplifying element, wherein each signal traverses the only one input impedance network.

7. The system of claim 1 wherein said output network comprises at least one capacitor.

8. The system of claim 1 wherein said output network comprises at least one transmission line of a predetermined electrical length.

9. A communications system comprising:
    an interface for receiving signals through at least one of a plurality of frequency bands;
    an amplifier for scaling signal levels of the received signals, said amplifier further comprising:
        an amplifying element having at least one terminal;
        a plurality of transmission lines for adjusting an input impedance to said amplifying element to a selected value, only a first one of said transmission lines being connected to said terminal to form a serial relation with said amplifying element, a second one of said transmission lines being connected at an end thereof to the first transmission line and at the other end thereof to an input of said amplifier; and
        an output network for providing a selected output impedance to said amplifying element, values of the input and output impedances being selected such that gain values afforded by said amplifier to components of said received signals in said plurality of frequency bands are relatively high, with respect to gain values to components of said received signals outside said plurality of frequency bands.

10. The system of claim 9 wherein said amplifying element is a transistor.

11. The system of claim 10 wherein said transistor is an FET.

12. The system of claim 9 wherein said plurality of frequency bands include a receive band for cellular communications.

13. The system of claim 9 wherein said plurality of frequency bands include a receive band for PCS use.

14. The system of claim 9 further comprising only one input impedance network including the plurality of transmission lines for adjusting the input impedance to the amplifying element, wherein each received signal traverses the only one input impedance network.

15. The system of claim 9 wherein said output network comprises at least one capacitor.

16. The system of claim 9 wherein said output network comprises at least one transmission line of a predetermined electrical length.

17. A method for designing an amplifier for scaling signal levels of signals communicated over at least one of a plurality of frequency bands, said amplifier including a plurality of transmission lines, and an amplifying element which has at least one terminal, the method comprising:

connecting only a first one of said transmission lines to said terminal to form a serial relation with said amplifying element;

connecting a second one of said transmission lines at an end thereof to the first transmission line and at the other end thereof to an input of the amplifier;

adjusting an input impedance to said amplifying element to a selected value using said plurality of transmission lines; and providing a selected output impedance to said amplifying element using an output network, values of the input and output impedances being selected such that gain values afforded by said amplifier to components of said signals in said plurality of frequency bands are relatively high, with respect to gain values to components of said signals outside said plurality of frequency bands.

18. The method of claim 17 wherein said plurality of frequency bands include a frequency band for cellular communications.

19. The method of claim 17 wherein said plurality of frequency bands include a frequency band for PCS use.

* * * * *